(12) United States Patent
Zhang et al.

(10) Patent No.: US 12,532,750 B2
(45) Date of Patent: Jan. 20, 2026

(54) CLIP FOR A DISCRETE POWER SEMICONDUCTOR PACKAGE

(71) Applicant: Littelfuse Semiconductor (Wuxi) Co., ltd., Wuxi (CN)

(72) Inventors: Lucas Zhang, Wuxi (CN); Charlie Cai, Wuxi (CN); Jifeng Zhou, Wuxi (CN)

(73) Assignee: Littelfuse Semiconductor (Wuxi) Co., Ltd., Wuxi (CN)

( * ) Notice: Subject to any disclaimer, the term of this patent is extended or adjusted under 35 U.S.C. 154(b) by 436 days.

(21) Appl. No.: 18/132,490

(22) Filed: Apr. 10, 2023

(65) Prior Publication Data

US 2023/0326838 A1 Oct. 12, 2023

(30) Foreign Application Priority Data

Apr. 8, 2022 (CN) .......................... 202220808365.7

(51) Int. Cl.
*H01L 23/495* (2006.01)
*H01L 23/00* (2006.01)
*H01L 23/40* (2006.01)

(52) U.S. Cl.
CPC .... *H01L 23/49568* (2013.01); *H01L 23/4093* (2013.01); *H01L 23/49503* (2013.01); *H01L 23/49517* (2013.01); *H01L 23/49524* (2013.01); *H01L 23/49551* (2013.01); *H01L 23/49555* (2013.01); *H01L 23/49575* (2013.01); *H01L 23/564* (2013.01); *H01L 24/40* (2013.01); *H01L 24/41* (2013.01); *H01L 24/49* (2013.01); *H01L 24/84* (2013.01); *H01L 2224/40175* (2013.01); *H01L 2924/181* (2013.01)

(58) Field of Classification Search
CPC ........ H01L 23/49568; H01L 23/49503; H01L 23/49517; H01L 23/564; H01L 23/49575; H01L 23/4093; H01L 23/49551; H01L 23/49555; H01L 23/49524; H01L 24/40; H01L 24/84; H01L 24/49; H01L 24/41; H01L 2924/181
See application file for complete search history.

(56) References Cited

U.S. PATENT DOCUMENTS

| 2015/0243587 A1 | 8/2015 | Yang |
| 2018/0331021 A1 | 11/2018 | Qin et al. |
| 2019/0139866 A1* | 5/2019 | Kuraya ................. H01L 24/29 |

(Continued)

FOREIGN PATENT DOCUMENTS

| JP | 2004031516 A | 1/2004 |
| JP | 2012033756 A | 2/2012 |

OTHER PUBLICATIONS

European Search Report and Written Opinion for Application No. EP23167217, mailed Aug. 11, 2023, 8 pages.

*Primary Examiner* — Alonzo Chambliss
(74) *Attorney, Agent, or Firm* — KDW Firm PLLC

(57) ABSTRACT

A discrete power semiconductor package includes a semiconductor chip, a heatsink, a first lead, a second lead, and a clip. The heatsink is adjacent the semiconductor chip and draws heat away from the semiconductor chip. The clip binds the semiconductor chip to the heatsink and includes a chip linker, a first terminal, and a second terminal. The chip linker is atop the semiconductor chip. The first terminal connects to the first lead and the second terminal connects to the second lead.

20 Claims, 10 Drawing Sheets

(56) References Cited

U.S. PATENT DOCUMENTS

2019/0326204 A1\* 10/2019 Miura ............... H01L 23/49562
2020/0350272 A1    11/2020 Hong
2021/0287969 A1\*  9/2021 Sato ................. H01L 23/49551

\* cited by examiner

CLIP FOR A DISCRETE POWER SEMICONDUCTOR PACKAGE

CROSS REFERENCE TO RELATED APPLICATION

This application claims the benefit of priority to, Chinese Patent Application No. 2022208083657, filed Apr. 8, 2022, entitled "Discrete Power Semiconductor Package," which application is incorporated herein by reference in its entirety.

FIELD OF THE DISCLOSURE

Embodiments of the present disclosure relate to discrete semiconductor packages and, more particularly, to a high reliability TO-263 discrete semiconductor package.

BACKGROUND

A discrete semiconductor is a device specified to perform an elementary electronic function and is not divisible into separate components functional in themselves. Power semiconductors are used as switches or rectifiers in power electronics. Diodes, transistors, thyristors, and rectifiers are examples of discrete power semiconductors. Discrete power semiconductors are found in a variety of different environments, from very low power systems up to very high power systems.

There are many packages for housing discrete power semiconductors. TO-263, for example, is a semiconductor package type intended for surface mounting on printed circuit boards (PCBs). The TO-263 satisfies JEDEC standards, where JEDEC is a global industry standards group for microelectronics. A package characterized by a generally rectangular-cube shape, the TO-263 has a flat heat sink on its bottom side, with the leads (terminals) being bent to lie against the surface of the PCB. The TO-263 package also has a large thermal plane in its bottom surface, for connection, along with the leads, to the PCB.

One development direction for discrete power semiconductor packages is higher reliability, especially for automotive and aviation products. Existing TO-263 packages are designed for commercial applications but are unable to pass high humidity tests required for automotive and aviation applications.

There are TO-263 packages that satisfy the AEC Q101 standard. AEC-Q101 is a global standard that defines minimum stress test driven requirements and conditions for discrete (active) electronic components (e.g., transistors, diodes, thyristors) used in automotive applications. The AEC Q101-ready packages use a wire bonding process. Wire bonding is a solid phase welding process where two metallic materials (wire and pad surface) are brought into intimate contact, forming a wire bond. Unfortunately, wire-bonded TO-263 packages exhibit a very low heat dissipation speed. Further, these packages are unidirectional, whereas some automotive and aviation customers need bidirectional products.

It is with respect to these and other considerations that the present improvements may be useful.

SUMMARY

This Summary is provided to introduce a selection of concepts in a simplified form that are further described below in the Detailed Description. This Summary is not intended to identify key or essential features of the claimed subject matter, nor is it intended as an aid in determining the scope of the claimed subject matter.

An exemplary embodiment of a discrete power semiconductor package in accordance with the present disclosure may include a semiconductor chip, a heatsink, a first lead, a second lead, and a clip. The heatsink is adjacent the semiconductor chip and draws heat away from the semiconductor chip. The clip binds the semiconductor chip to the first lead and the second lead and includes a chip linker, a first terminal, and a second terminal. The chip linker is atop the semiconductor chip. The first terminal connects to the first lead and the second terminal connects to the second lead.

DETAILED DESCRIPTION

A discrete power semiconductor package is disclosed to support transient voltage suppression semiconductor devices, such as thyristors, silicon controlled rectifiers, and triacs. A type of TO-263 package, the discrete power semiconductor package features a heatsink having a dual gauge lead frame design. The heatsink includes a chip tray platform for housing a semiconductor chip and a flange surrounding the heatsink. The chip tray platform and the flange protect the chip from moisture. The discrete power semiconductor package also features a clip for binding the semiconductor chip to the heatsink. The clip includes a chip linker and two terminals for connecting to leads of the lead frame. The discrete power semiconductor package supports both unidirectional and bidirectional semiconductor chips.

For the sake of convenience and clarity, terms such as "top", "bottom", "upper", "lower", "vertical", "horizontal", "lateral", "transverse", "radial", "inner", "outer", "left", and "right" may be used herein to describe the relative placement and orientation of the features and components, each with respect to the geometry and orientation of other features and components appearing in the perspective, exploded perspective, and cross-sectional views provided herein. Said terminology is not intended to be limiting and includes the words specifically mentioned, derivatives therein, and words of similar import.

Figure 1A:
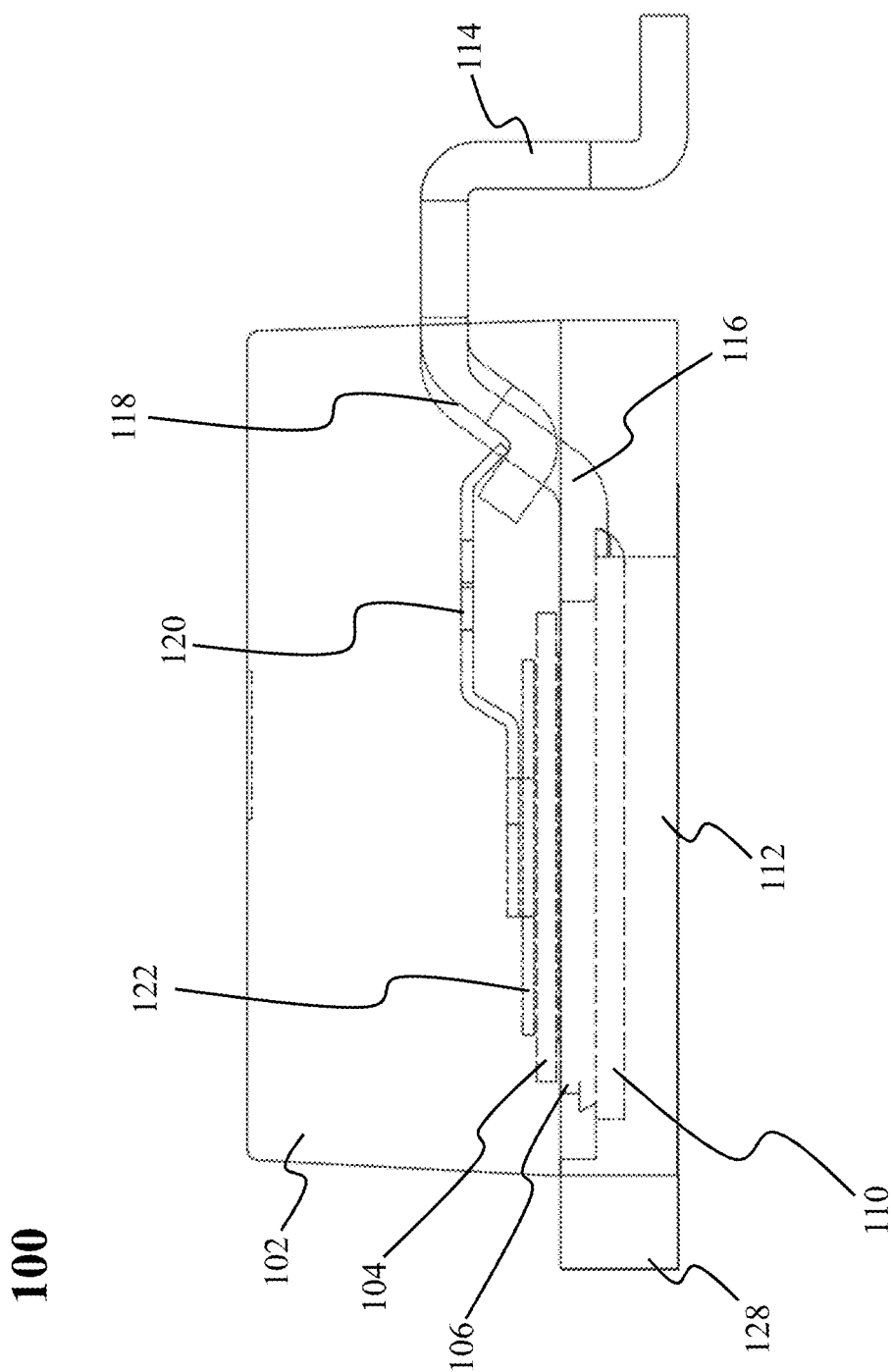
FIGS. 1A-1C are diagrams illustrating a discrete power semiconductor package, in accordance with exemplary embodiments.
Figure 1B:
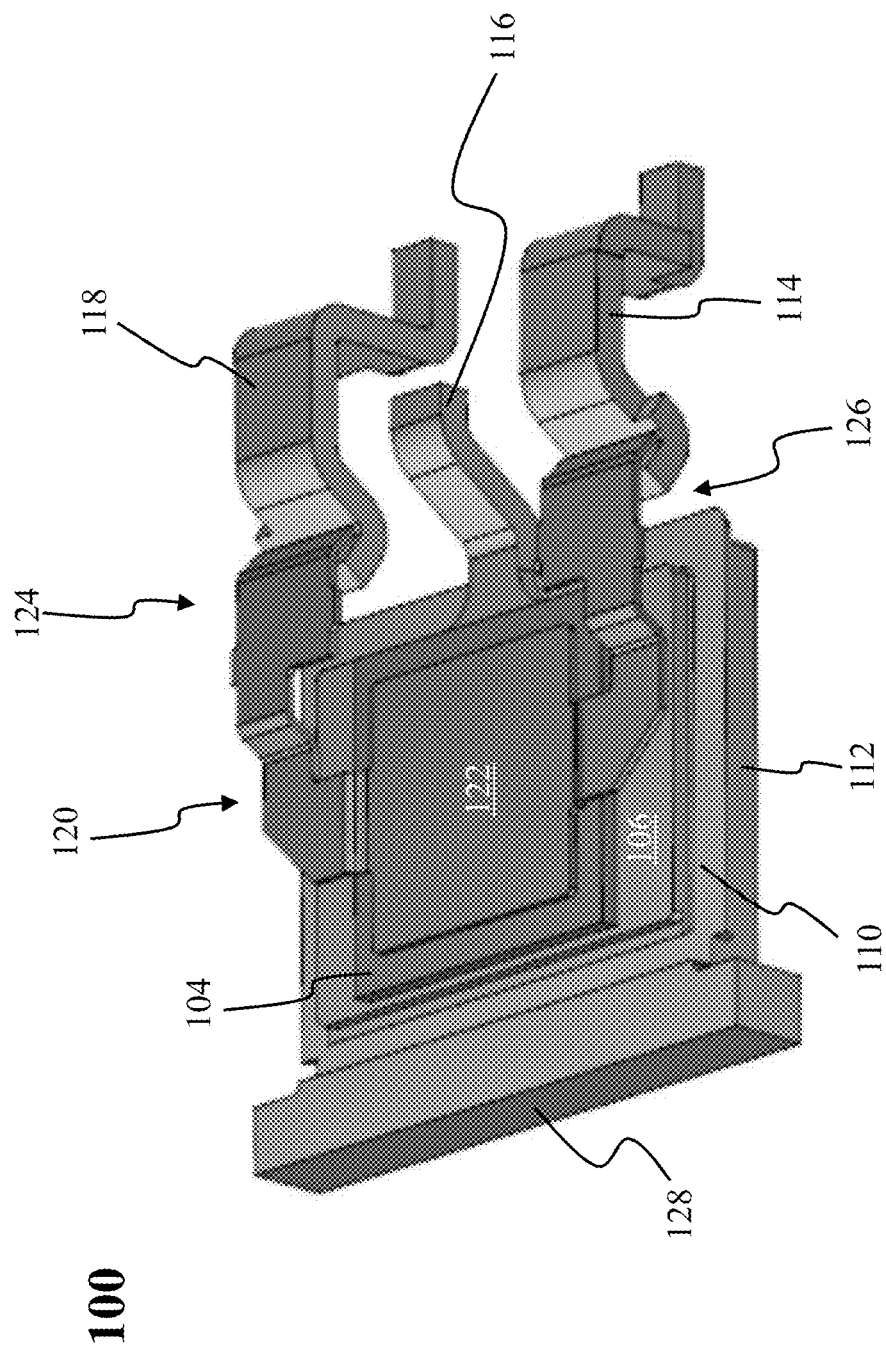
Figure 1C:
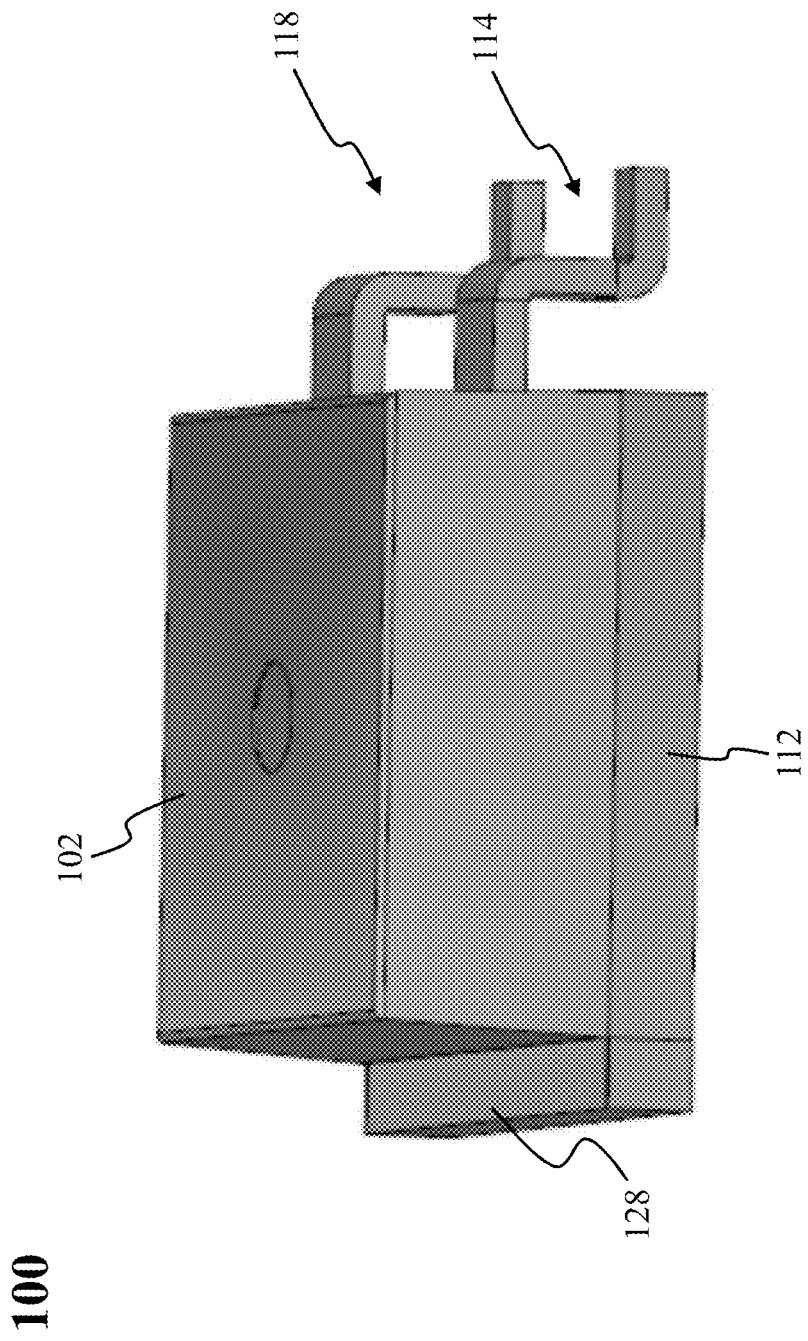

FIGS. 1A-1C are representative drawings of a discrete power semiconductor package (DPSP) 100 for housing a discrete semiconductor, according to exemplary embodiments. FIG. 1A is a side view of the DPSP 100; FIG. 1B is a perspective view of the DPSP without the encapsulating compound; and FIG. 1C is a perspective view of the DPSP with the encapsulating compound.

In exemplary embodiments, the DPSP 100 is a type of TO-263 package. Further, in some embodiments, the DPSP 100 houses a transient voltage suppression device, such as a thyristor. In other embodiments, the DPSP 100 houses a silicon controlled rectifier (SCR). In still other embodiments, the DPSP 100 houses two back-to-back SCRs, known as a triac. While the thyristor and SCR are unidirectional devices, the triac is a bidirectional device. Thus, in exemplary embodiments, the DPSP 100 is suitable for either unidirectional or bidirectional semiconductor devices.

The DPSP 100 features a semiconductor chip 104, a heatsink 112, and a clip 120. The heatsink 112 is designed to draw heat away from the semiconductor chip 104 and features a side wall 128 and three leads (terminals) 114, 116, and 118. In exemplary embodiments, the side wall 128 is disposed on one side of the DPSP 100 and the three leads 114, 116, and 118 are disposed on a second side, where the second side is opposite the side wall. In exemplary embodiments, disposed on a top surface of the heatsink 112 is a chip tray platform 106 for seating the semiconductor chip 104. In exemplary embodiments, a flange 110 surrounds the chip tray platform 106, with the flange surrounding the heatsink 112.

The heatsink 112, the two leads 114, 118, and the end lead 116 are linked as one part and are thus known in the art as a dual gauge lead frame design. The heatsink 112, the chip tray platform 106, side wall 128, and the leads 114, 116, 118 are formed from a single, unitary electrically conductive material, such as copper or copper alloy, in exemplary embodiments.

In addition to helping prevent moisture from getting to the semiconductor chip 104, the flange 110 and the chip tray platform 106 also help to hold the semiconductor chip in place. In exemplary embodiments, the chip tray platform 106 is slightly larger than the semiconductor chip 104 and is elevated at the circumferential edge. The chip tray platform 106 thus provides a sort of "fence" around the semiconductor chip 104, which help prevent moisture from getting to the chip.

When the DPSP 100 is on a printed circuit board (PCB), there can be outside stress, such as bending or folding, that causes internal stress, particularly on the semiconductor chip 104. Particularly in tough working environments, such as may occur in automotive applications, the DPSP 100 may be subjected to mechanical stresses, moisture, dust, debris, and so on. In exemplary embodiments, the novel design of the DPSP 100 protects the semiconductor chip 104 from these external mechanical stresses and reduces internal stress.

In addition to the heatsink 112, the chip tray platform 106, and the side wall 128, the dual gauge lead frame design further includes the first lead 114, the second lead 116, and the third lead 118. In exemplary embodiments, the second lead 116 is connected to the heatsink 112, while the first lead 114 and the second lead 118 are separate from the heatsink, though still part of the dual gauge lead frame design. Selected elements of the dual gauge lead frame design, including the integrated heatsink 112, chip tray platform 106, and three leads 114, 116, and 118, are described and shown in more detail in FIGS. 2A-2C, below.

In exemplary embodiments, the DPSP 100 further includes a clip 120, disposed over the semiconductor chip 104, which holds the semiconductor chip in place. Further, the clip 120 engages with the leads 114 and 118 of the heatsink 112 to establish an electrical connection therebetween. Broadly, the clip 120 includes a chip linker 122, a first clip terminal 124, and a second clip terminal 126. The chip linker 122 is the part of the clip 120 that is disposed over the semiconductor chip 104. In exemplary embodiments, the chip linker 122 is substantially rectangular in shape and covers a substantial portion of the semiconductor chip 104, although some portion of the semiconductor chip is visible at the edges of the chip linker. Put another way, the chip linker 122 of the clip 120 has a first surface area and the semiconductor chip 104 has a second surface area, with the second surface area being slightly larger than the first surface area.

The first clip terminal 124 and the second clip terminal are disposed on opposing sides of the chip linker 122. In exemplary embodiments, the first clip terminal 124 is a mirror image of the second clip terminal 126. In exemplary embodiments, the chip linker 122, the first clip terminal 124, and the second clip terminal 126 of the clip 120 are formed of a single, unitary electrically conductive material, such as copper or copper alloy.

The first clip terminal 124 is designed to connect with the first lead 114 of the heatsink 112 while the second clip terminal 126 is designed to connect with the third lead 118 of the heatsink. Because the first lead 114 and third lead 118 are not connected at their ends to the heatsink 112, the clip 120, or more precisely, the first clip terminal 124 and the second clip terminal 126, respectively, establish connection between the first lead 118 and the third lead 118, such that the leads are connected to the heatsink 112. The clip 120 is described and shown in more detail in FIGS. 3A-3D, below.

In exemplary embodiments, as illustrated in FIGS. 1A and 1C, the internal structure of the DPSP 100 are encapsulated in a compound 102, such as an epoxy composite. Also, in exemplary embodiments, the components of the DPSP 100 are connected to one another using solder paste. For example, there is solder paste disposed between the semiconductor chip 104 and the heatsink 112. Thus, the solder paste would be deposited on a top surface of the heatsink 112 and on a bottom surface of the semiconductor chip 104. Similarly, there is solder paste disposed between the chip linker 122 of the clip 120 and the semiconductor chip 104. Thus, the solder paste would be deposited on a top surface of the semiconductor chip 104 and on a bottom surface of the chip linker 122. Also, solder paste would be deposited between the first clip terminal 124 and the second clip terminal 126 of the clip 120 and respective leads 114, 118 of the heatsink 112. Thus, the solder paste would be deposited on a top surface of the first lead 114 and a bottom surface of the first clip terminal 124 and solder paste would be deposited on a top surface of the third lead 118 and a bottom surface of the second clip terminal 126.

Figure 2A:
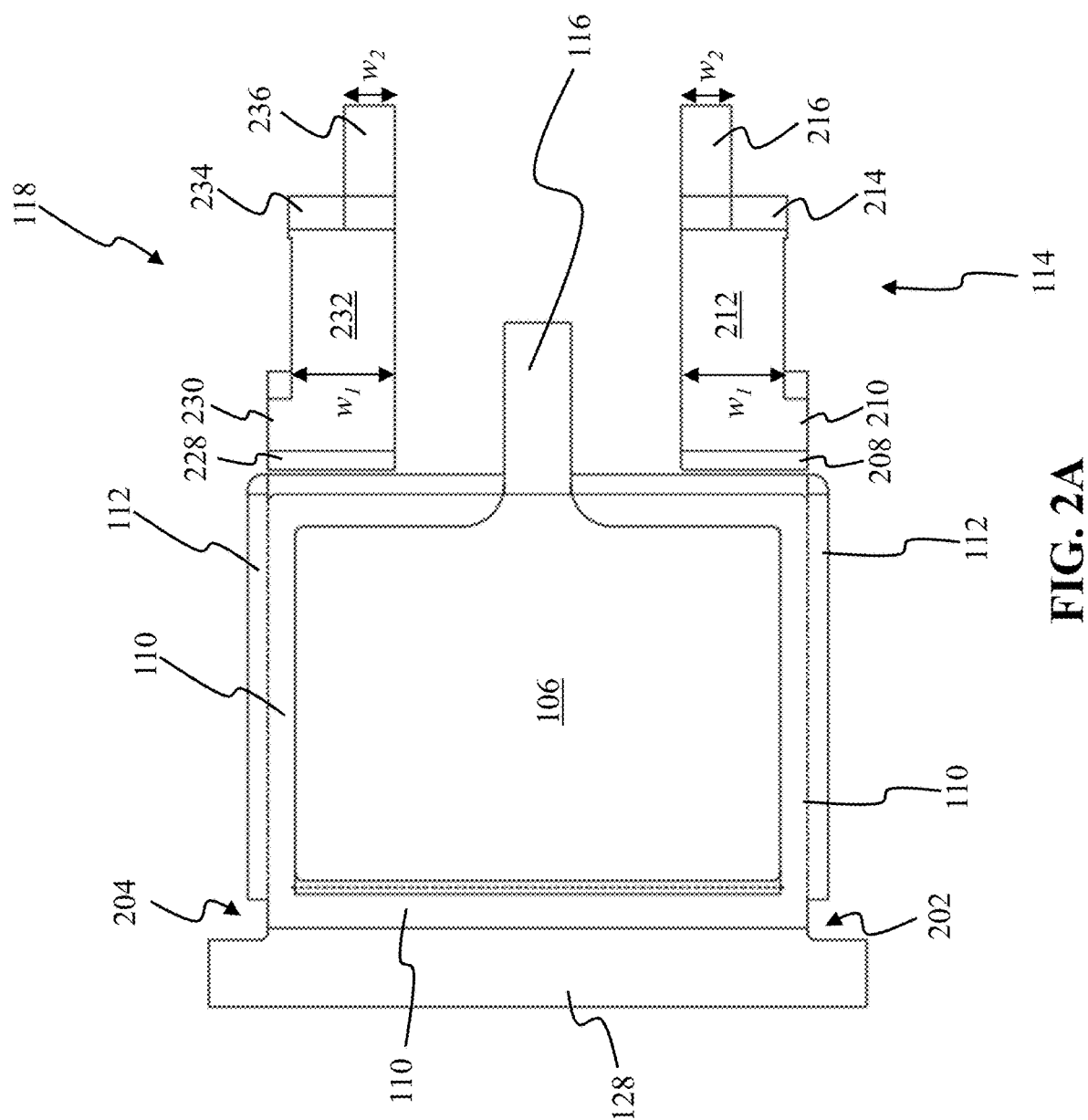
FIGS. 2A-2C are diagrams illustrating a heatsink used in the discrete power semiconductor package of FIGS. 1A-1C, in accordance with exemplary embodiments.
Figure 2B:
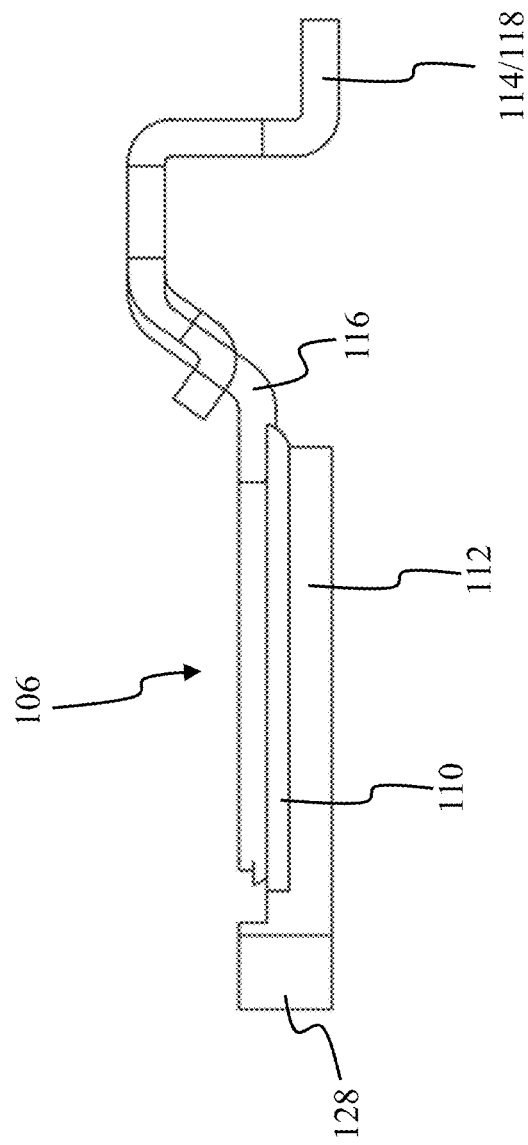
Figure 2C:
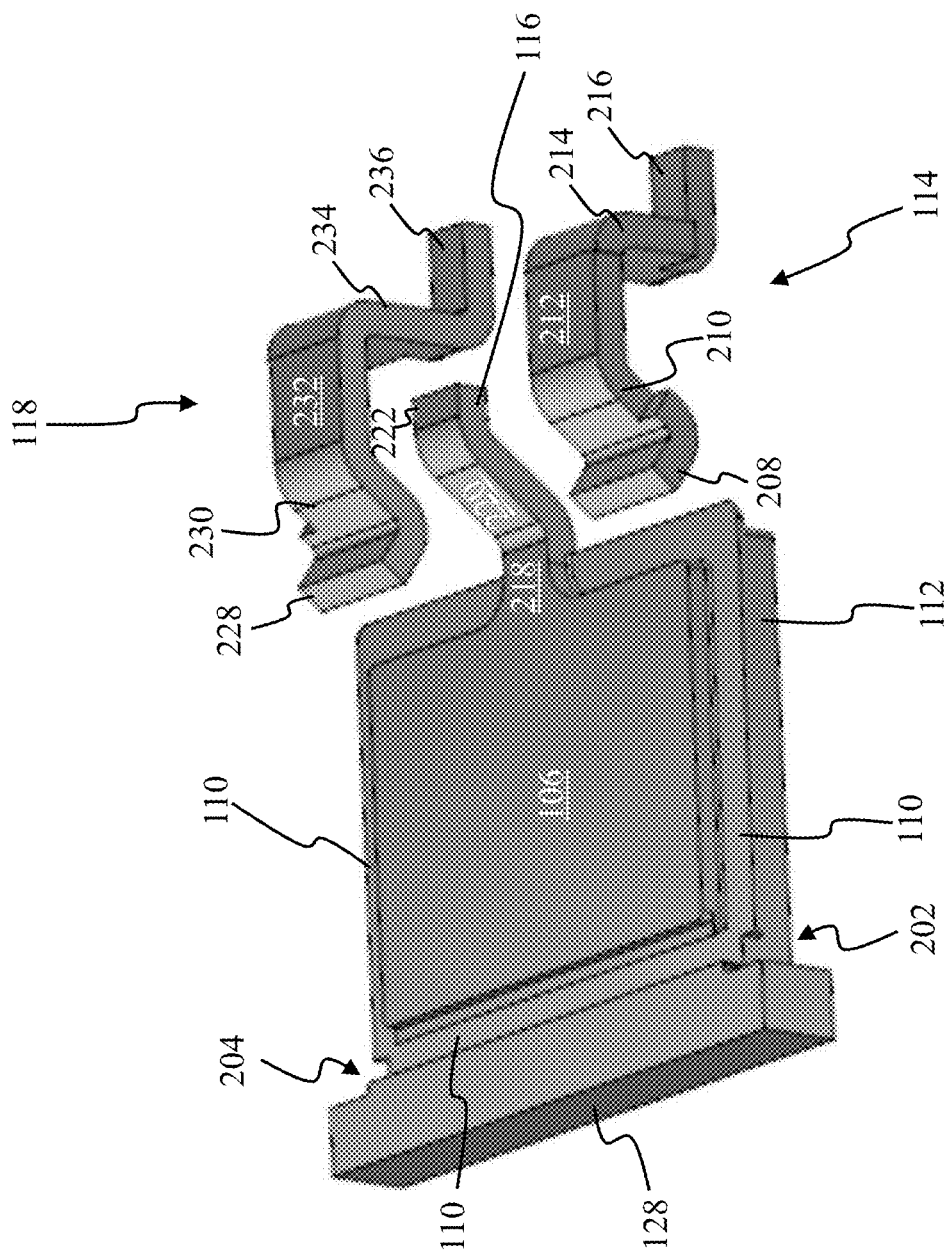

FIGS. 2A-2C are representative drawings of some elements of the dual gauge lead frame design used in the DPSP 100 of FIGS. 1A-1C, according to exemplary embodiments. FIG. 2A is an overhead view, FIG. 2B is a side view, and FIG. 2C is a perspective view of the heatsink 112. As explained above, the heatsink 112 includes the side wall 128, with the chip tray platform 106 disposed above the heatsink for holding the semiconductor 104 (not shown), with a flange 110 surrounding the heatsink.

In exemplary embodiments, the heatsink 112 features protection notches 202 and 204, disposed on two sides of the heatsink and chip tray platform 106, and adjacent the side wall 128. The protection notches 202 and 204 facilitate holding the compound 102 in the molding process during manufacture, thus avoiding delamination between the heatsink 112 and the compound material (e.g., epoxy composite). Further, as the epoxy composite compound 102 is deposited over the components of the DPSP 100, the protection notches 202 and 204 enable mechanical linked force, allowing the DPSP to be held from the bottom.

Further, in exemplary embodiments, the leads 114, 116, and 118 are designed strategically to enable the DPSP 100 to be surface-mount attached to the PCB. Leads 114 and 118 are identical, in exemplary embodiments, with each being composed of several segments. As illustrated in FIGS. 2A and 2C, lead 114 features, in sequential order: an end 208, a curve 210, a flat portion 212, a vertical portion 214, and a connect portion 216. Lead 118 features, in sequential order: an end 228, a curve 230, a flat portion 232, a vertical portion 234, and a connect portion 236. The end 208 of lead 114 is soldered to the first clip terminal 124 of the clip 120 (FIG. 1B); similarly, the end 228 of lead 118 is soldered to the second clip terminal 126 of the clip.

In exemplary embodiments, the connect portion 216 of lead 114 is flat and in the same plane as the heatsink 112; accordingly, the connect portion is to be soldered onto a PCB (not shown). Similarly, the connect portion 236 of lead 118 is flat and in the same plane as the heatsink 112; accordingly, the connect portion is to be soldered onto a PCB. Further, as illustrated in FIG. 2A, flat portion 232 of lead 118 has a first width, $w_1$ and connect portion 236 has a width, $w_2$; similarly, flat portion 212 of lead 114 has the width, $w_1$ and connect portion 216 has the width, $w_2$, with width, $w_1$, being greater than width, $w_2$, in exemplary embodiments ($w_1 > w_2$). In exemplary embodiments, connect portions 216 and 236 are connected with the same chip electrical pole.

Mainly for the process use in the design, the second lead 116 is also composed of multiple segments, in sequential order: a connector 218, a curve 220, and an end 222. In exemplary embodiments, the connector 218 connects directly to the heatsink 112. In exemplary embodiments, the curved shape of the second lead 116 provides a mechanism for heat to dissipate away from the semiconductor chip 104 (FIG. 1B).

Figure 3A:
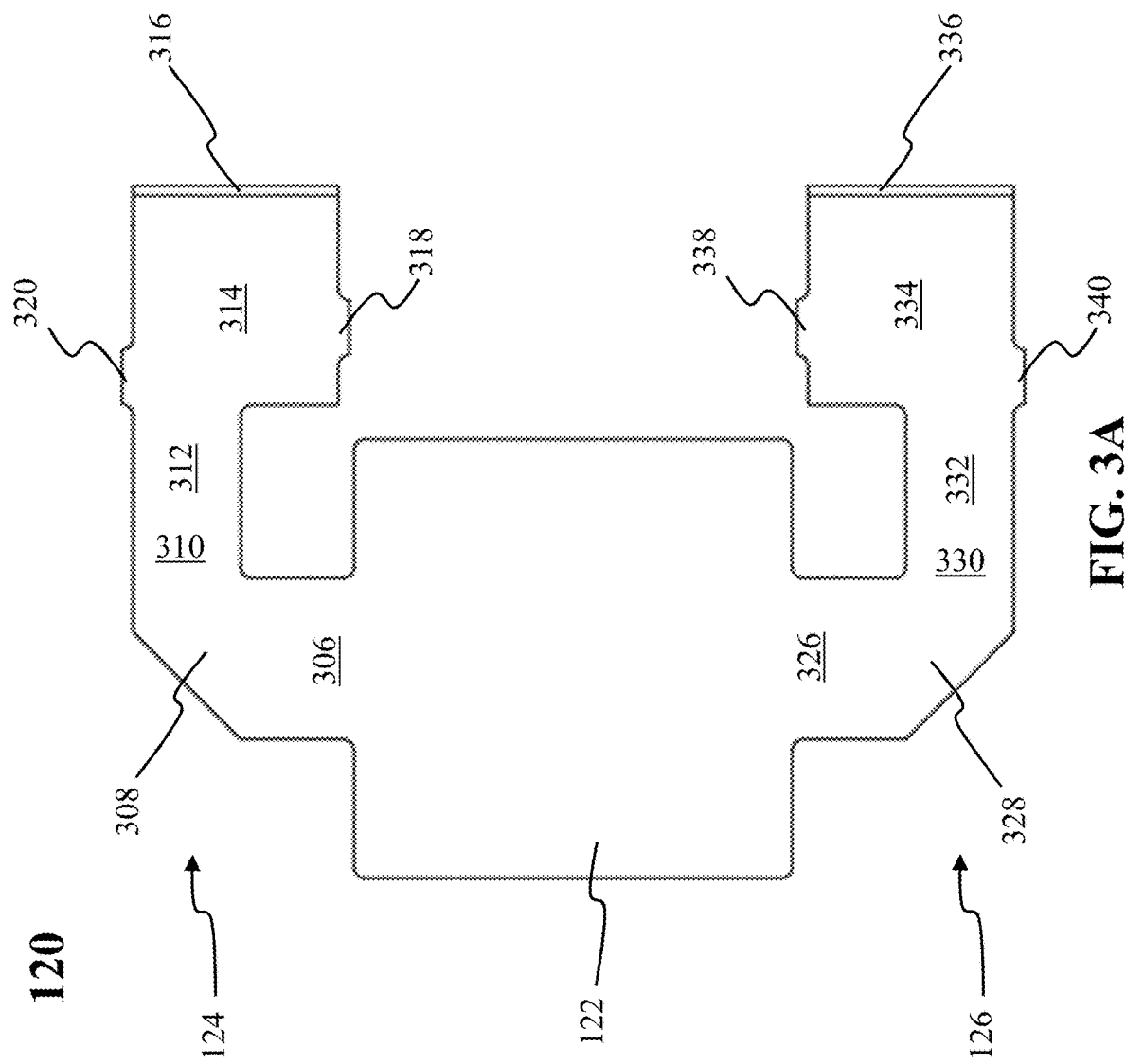
FIGS. 3A-3D are diagrams illustrating a clip used by the discrete power semiconductor package of FIGS. 1A-1C, in accordance with exemplary embodiments.
Figure 3B:
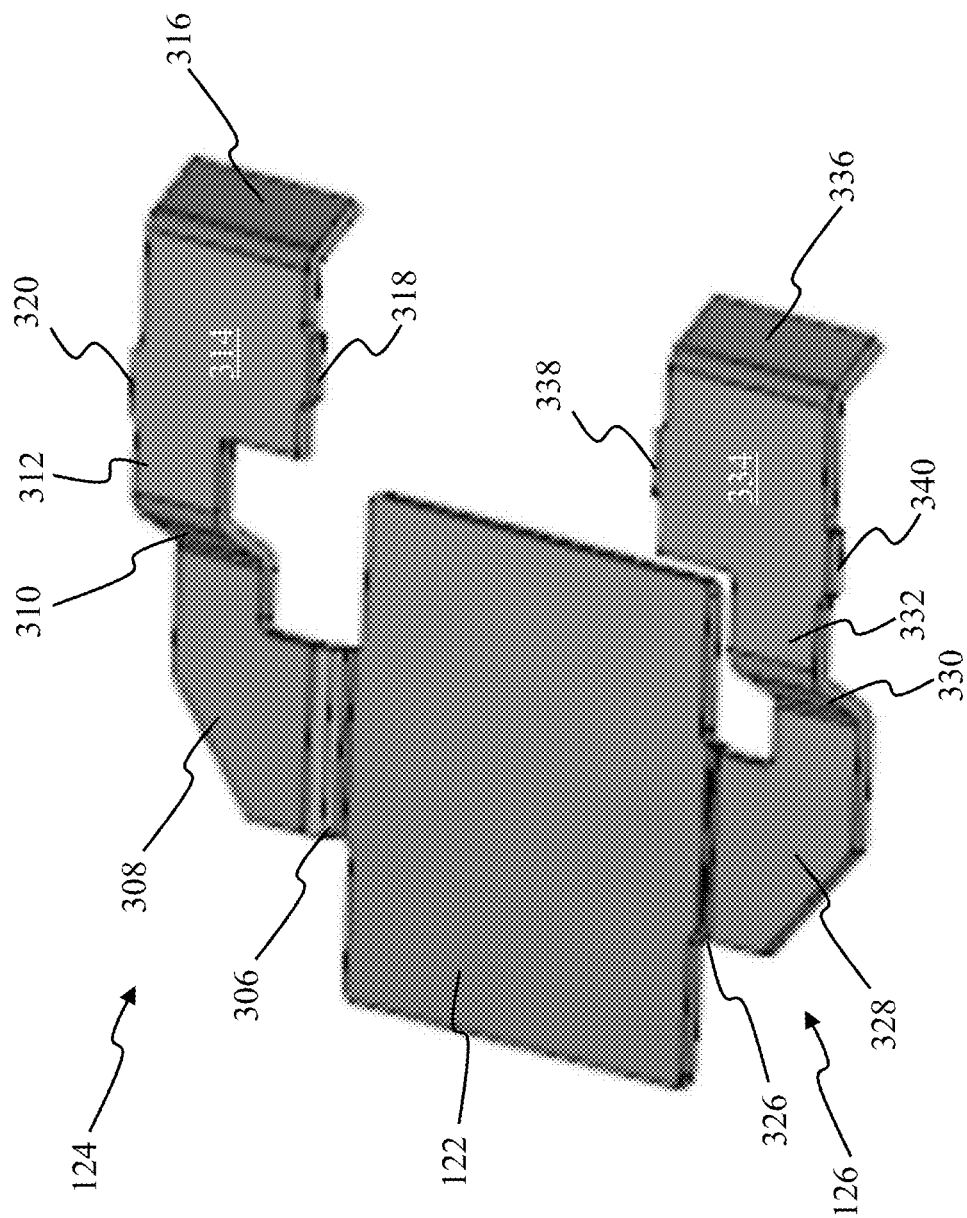
Figure 3C:
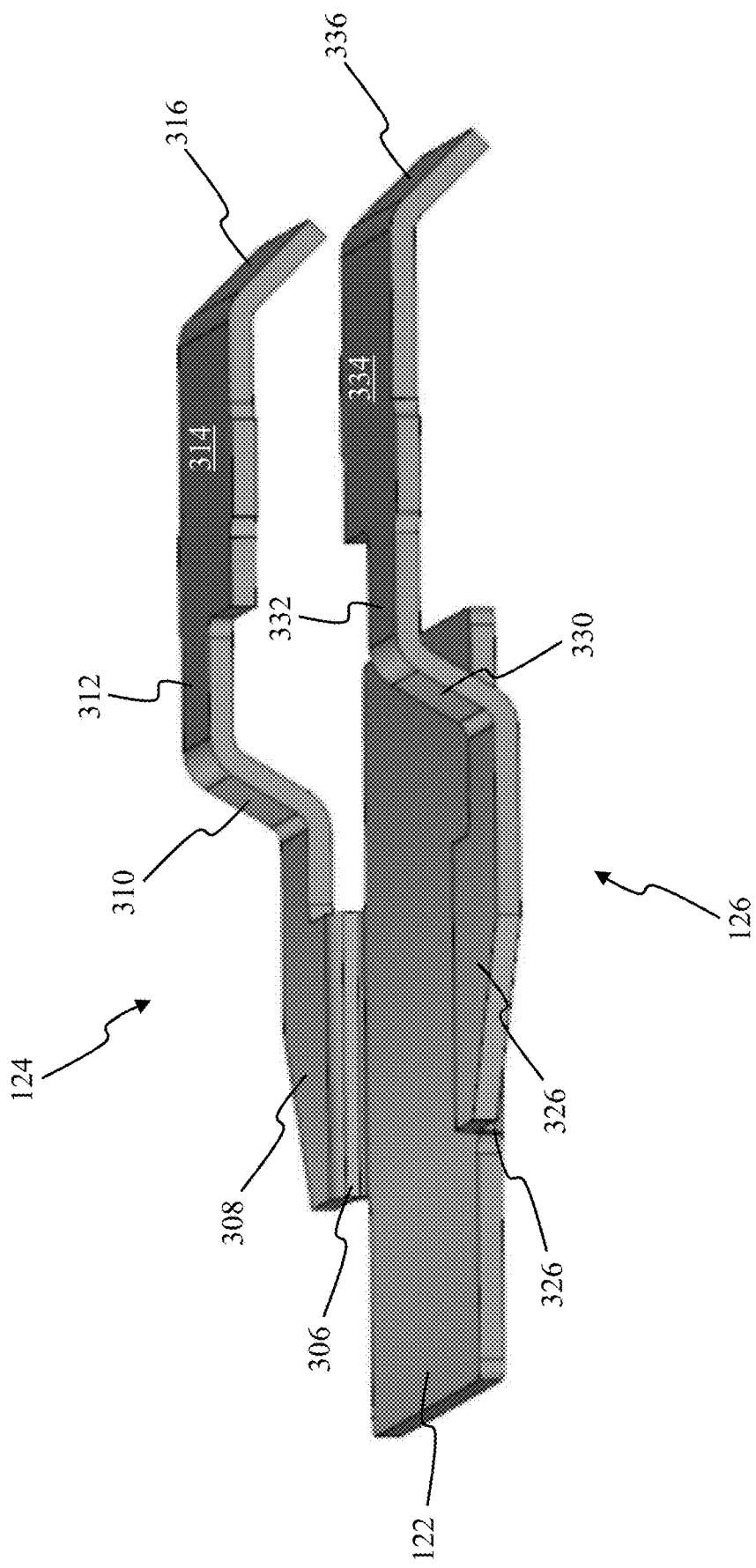
Figure 3D:
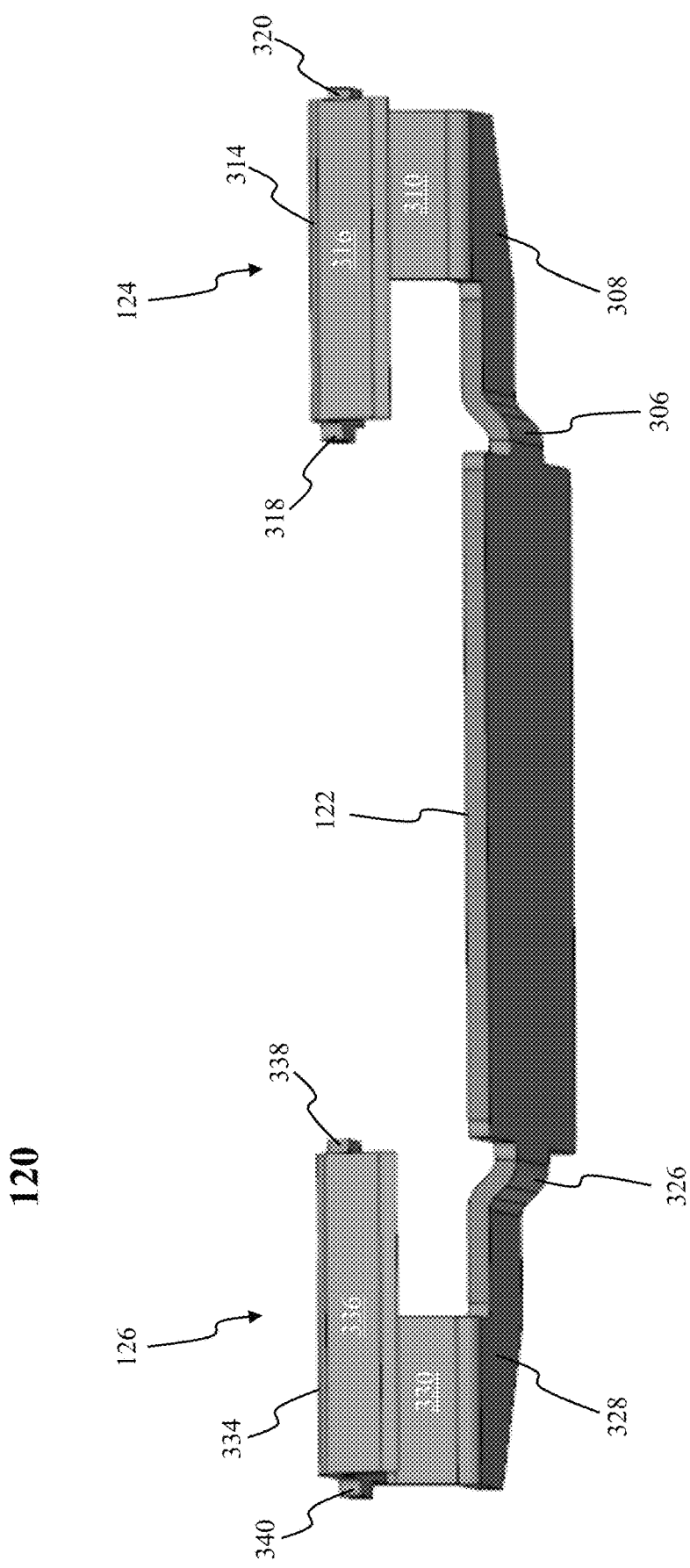

FIGS. 3A-3D are representative drawings of the clip 120 used by the DPSP 100 of FIGS. 1A-1C, according to exemplary embodiments. FIG. 3A is an overhead view and FIGS. 3B-3D are perspective views of the clip 120. The clip 120 features the chip linker 122 as well as the first clip terminal 124 and the second clip terminal 126, as already shown, with the first clip terminal 124 being a mirror image of the second clip terminal 126.

In exemplary embodiments, like the leads 114 and 118 of the heatsink 112, the first clip terminal 124 and the second clip terminal 126 of the exemplary clip 120 each have several segments. The first clip terminal 124 features, in sequential order, a bent bridge 306, a flat corner 308, a bend 310, a narrow portion 312, a flat portion 314, and a terminal 316. Similarly, the second clip terminal 126 features, in sequential order, a bent bridge 326, a flat corner 328, a bend 330, a narrow portion 332, a flat portion 334, and a terminal 336. The bent bridge 306 connects the first clip terminal 124 to the chip linker 122; similarly, the bent bridge 326 connects the second clip terminal 126 to the chip linker.

Further, in exemplary embodiments, the terminal 316 of the first clip terminal 124 is to be soldered to the first lead 114 of the heatsink 112 while the terminal 336 of the second clip terminal 126 is to be soldered to the third lead 118 of the heatsink. Soldering material is placed on a bottom surface of each terminal 316 and 336 and on a top surface of respective ends 208 and 228 of the leads 114 and 118. The leads 114, 118 of the heatsink 112 and the clip terminals 124, 126 of the clip 120 facilitate heat transfer away from the semiconductor chip 104, in exemplary embodiments. Further, in exemplary embodiments, the leads 114, 118 and the clip terminals 124, 126 are easy to manufacture.

In exemplary embodiments, the first clip terminal 124 features an internal process bar 318 and an external process bar 320. Similarly, the second clip terminal 126 features an internal process bar 338 and an external process bar 340. The internal process bars 318 and 338 and the external process bars 320 and 340 are process support bars.

As illustrated particularly in FIGS. 3C and 3D, the segments of first and second clip terminals 124 and 126 of the chip 120 occupy different planes. The chip linker 122 occupies a first plane, the flat corners 308 and 328 occupy a second plane, slightly elevated from the first plane, and the narrow portion 312, flat portion 314, narrow portion 332, and flat portion 334 occupy a third plane, elevated from the second plane. Thus, while the chip linker 122 is to be soldered to the semiconductor chip 104 (FIG. 1B), the first clip terminal 124 and the second clip terminal 126 are disposed distal to the semiconductor chip. In exemplary embodiments, while the heatsink 112 is designed to draw heat away from the semiconductor chip 104, the design of the clip 120 also facilitates minimizing the amount of heat building up on the semiconductor chip.

Further, in exemplary embodiments, the clip 120 provides an alternative to the practice of wire bonding of prior art TO-263 packages. Wire-bonded discrete power semiconductor packages do not dissipate heat very well. By using the clip 120 on the DPSP 100, no wire bonding is performed. Thus, in exemplary embodiments, the DPSP 100 dissipates heat much faster than prior art discrete power semiconductor packages.

Further, in some embodiments, by linking the clip 120 with the two leads 114 and 118, the DPSP 100 has better product reliability than prior art discrete power semiconductor packages. Also, the DPSP 100 can support unidirectional semiconductor chips, such as thyristors and silicon controlled rectifiers (SCRs), in some embodiments. Further, in exemplary embodiments, the DPSP 100 can support bidirectional semiconductor chips, such as triacs (two back-to-back SCRs). Thus, in exemplary embodiments, the DPSP 100 is suitable for either unidirectional or bidirectional semiconductor devices.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations, and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A discrete power semiconductor package comprising:
   a semiconductor chip;
   a heatsink disposed adjacent the semiconductor chip, the heatsink to draw heat away from the semiconductor chip;
   a first lead;
   a second lead; and
   a clip configured to mechanically bind the semiconductor chip to the heatsink and to electrically couple the semiconductor chip to the first lead and the second lead, the clip comprising:
      a chip linker disposed atop and directly contacting the semiconductor chip, and a first terminal connected to the first lead and a second terminal connected to the second lead;

wherein the chip linker, the first terminal, and the second terminal are formed from a single, unitary conductive body separate from the heatsink and leads, and are bonded to the semiconductor chip and leads by respective layers of solder disposed between facing surfaces.

2. The discrete power semiconductor package of claim 1, the heatsink further comprising a chip tray platform, wherein the semiconductor chip is placed in the chip tray platform.

3. The discrete power semiconductor package of claim 2, wherein the heatsink is part of a dual gauge lead frame.

4. The discrete power semiconductor package of claim 2, further comprising a flange disposed circumferentially around the heatsink.

5. The discrete power semiconductor package of claim 4, wherein the flange and the chip tray platform protect the semiconductor chip from moisture.

6. The discrete power semiconductor package of claim 1, the heatsink further comprising a third lead.

7. The discrete power semiconductor package of claim 6, wherein the third lead is coupled to the heatsink.

8. The discrete power semiconductor package of claim 6, wherein the first lead and the third lead are to be connected to a printed circuit board using surface mount technology.

9. The discrete power semiconductor package of claim 6, the first lead further comprising:
an end to be coupled to the first terminal; and
a connect portion to be attached to a printed circuit board using surface mount techniques.

10. The discrete power semiconductor package of claim 6, the second lead further comprising:
an end to be coupled to the second terminal; and
a connect portion to be attached to a printed circuit board using surface mount techniques.

11. The discrete power semiconductor package of claim 1, the first terminal further comprising:
a bent bridge coupled to one side of the chip linker;
a flat corner coupled to the bent bridge;
a bend coupled to the flat corner; and
a flat portion coupled to the bend.

12. The discrete power semiconductor package of claim 11, wherein the chip linker is in a first plane, the flat corner is in a second plane, and the flat portion is in a third plane.

13. The discrete power semiconductor package of claim 12, wherein the first plane is not planar to the second plane, the first plane is not planar to the third plane, and the second plane is not planar to the third plane.

14. The discrete power semiconductor package of claim 12, wherein the second plane is elevated relative to the first plane.

15. The discrete power semiconductor package of claim 14, wherein the third plane is elevated relative to the second plane.

16. The discrete power semiconductor package of claim 1, the heatsink further comprising a first protection notch and a second protection notch.

17. The discrete power semiconductor package of claim 16, wherein the first protection notch is on a first side of the heatsink and the second protection notch is on a second side of the heatsink.

18. The discrete power semiconductor package of claim 17, the heatsink further comprising a side wall adjacent the semiconductor chip.

19. The discrete power semiconductor package of claim 18, wherein the first protection notch and the second protection notch are adjacent the side wall.

20. The discrete power semiconductor package of claim 19, wherein the first protection notch and the second protection notch facilitate handling of the discrete power semiconductor package.

* * * * *